United States Patent
Tomita

(10) Patent No.: US 7,109,775 B2
(45) Date of Patent: Sep. 19, 2006

(54) DELAY CIRCUIT HAVING REDUCED POWER SUPPLY VOLTAGE DEPENDENCY

(75) Inventor: Hiroyoshi Tomita, Kawasaki (JP)

(73) Assignee: Fujitsu Limted, Kawasaki (JP)

( * ) Notice: Subject to any disclaimer, the term of this patent is extended or adjusted under 35 U.S.C. 154(b) by 0 days.

(21) Appl. No.: 11/110,685

(22) Filed: Apr. 21, 2005

(65) Prior Publication Data

US 2005/0184787 A1    Aug. 25, 2005

Related U.S. Application Data

(63) Continuation of application No. PCT/JP03/05931, filed on May 13, 2003.

(51) Int. Cl.
*H03H 11/26* (2006.01)

(52) U.S. Cl. .................... 327/278; 327/276
(58) Field of Classification Search ............ 327/278, 327/276
See application file for complete search history.

(56) References Cited

U.S. PATENT DOCUMENTS

| 4,943,745 | A | * | 7/1990 | Watanabe et al. ........... 327/262 |
| 5,051,630 | A | * | 9/1991 | Kogan et al. ................ 327/262 |
| 5,130,564 | A | | 7/1992 | Sin |
| 5,497,263 | A | | 3/1996 | Masuda et al. |
| 5,574,707 | A | * | 11/1996 | Hirai ....................... 369/47.31 |
| 5,682,353 | A | * | 10/1997 | Eitan et al. ................. 365/233 |
| 6,191,630 | B1 | * | 2/2001 | Ozawa et al. ............... 327/278 |
| 6,624,679 | B1 | * | 9/2003 | Tomaiuolo et al. ......... 327/262 |

FOREIGN PATENT DOCUMENTS

| JP | 59-61312 A | 4/1984 |
| JP | 3-48925 U | 5/1991 |
| JP | 8-18413 A | 1/1996 |
| JP | 8-46496 A | 2/1996 |

* cited by examiner

*Primary Examiner*—Kenneth B. Wells
(74) *Attorney, Agent, or Firm*—Arent Fox PLLC

(57) ABSTRACT

A delay circuit includes: an input signal line (IN) through which an input signal is inputted; a capacitor (106) charged with and discharging electric charge; a first switch (101) connected to the input signal line and operating according to the input signal when the capacitor is to be charged with electric charge; a second switch (102) connected to the input signal line and operating according to the input signal when the electric charge is to be discharged from the capacitor; and a comparison circuit (107) comparing a voltage of the capacitor and a reference voltage to output a delay signal of the input signal.

20 Claims, 9 Drawing Sheets

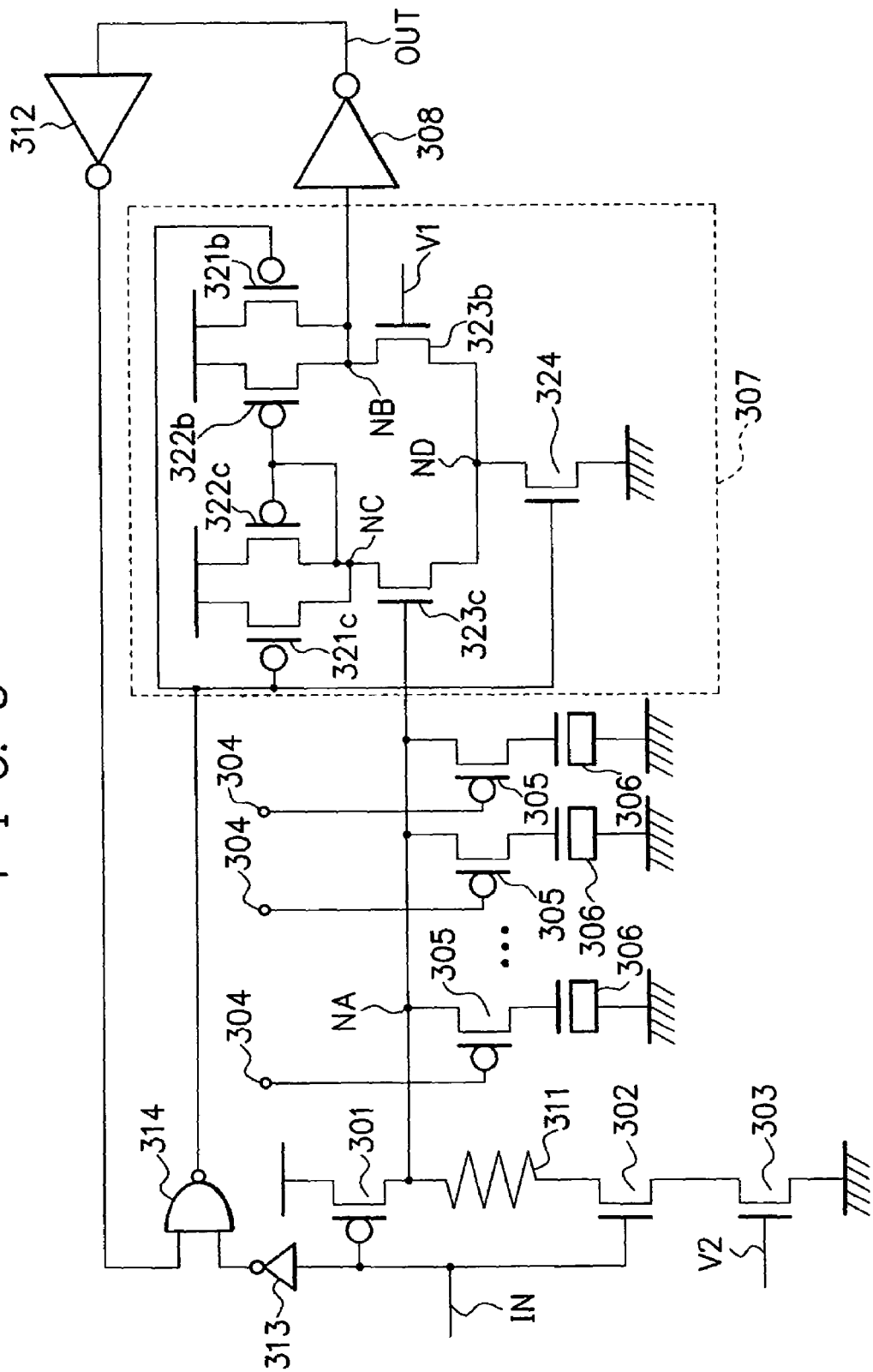
F I G. 3

-- PRIOR ART --

DELAY CIRCUIT HAVING REDUCED POWER SUPPLY VOLTAGE DEPENDENCY

This nonprovisional application is a continuation application of and claims the benefit of International Application No. PCT/JP03/05931 filed May 13, 2003. The disclosure of the prior application is hereby incorporated herein in its entirety by reference.

TECHNICAL FIELD

The present invention relates to a delay circuit, and more particularly, to a delay circuit having a capacitor.

BACKGROUND ART

FIG. 9 shows a configuration of a delay circuit according to a conventional art. An input signal line IN is connected to gates of a p-channel MOS transistor 901 and an n-channel MOS transistor 902. A source of the transistor 901 is connected to a power supply potential, and a source of the transistor 902 is connected to a ground potential. A resistor 903 is connected between drains of the transistors 901 and 902. They constitute a first-stage inverter.

An output of the first-stage inverter is the drain of the transistor 901, which is connected to an input signal line of a second-stage inverter. An output of the second-stage inverter is a drain of a transistor 902, which is connected to an input signal line of a third-stage inverter. An output of the third-stage inverter is a drain of a transistor 901, which is connected to an input signal line of an inverter 905. Capacitors 904 are connected to output signal lines of the first-stage to third-stage inverters respectively. A delay signal of an input signal inputted to the input signal line IN is outputted to an output signal line OUT of the inverter 905.

The resistors 903 and the capacitors 904 are capable of adjusting a delay time of the delay signal outputted from the output signal line OUT. The resistors 903 of the first-stage and third-stage inverters are resistors for adjusting a delay time at the time when the input signal inputted to the input signal line IN rises. The resistor 903 of the second-stage inverter is a resistor for adjusting a delay time at the time when the input signal inputted to the input signal line IN drops.

The delay time of the delay circuit has power supply voltage dependency. The higher the power supply voltage is, the shorter the delay time becomes. Specifically, when the power supply voltage becomes higher, a larger electric current flows between the sources and drains of the transistor 901 and 902, so that the switching speed of the transistors 901 and 902 becomes higher. As a result, the delay time becomes shorter.

The power supply voltage has been on the decrease in recent years. The lowered power supply voltage causes the delay time to be longer. Further, with a power supply voltage in a lower voltage range, the delay time tends to become still longer due to the influence of a threshold voltage of the transistors 901 and 902.

In a RAM such as a DRAM or a pseudo SRAM, a predetermined length of time or longer is constantly necessary for the restore time of memory cells. In a case where the restore time is set in a delay circuit using a high power supply voltage, the use of a low-power supply voltage results in an excessively long delay time if the power supply voltage dependency of the delay time is too large. The excessively long delay time results in an excessively long access time of the RAM determined by the low power supply voltage. This means that characteristics of the RAM are determined by the delay time of the delay circuit.

SUMMARY OF THE INVENTION

It is an object of the present invention to provide a delay circuit with reduced power supply voltage dependency.

According to one of the aspects of the present invention, provided is a delay circuit including: an input signal line through which an input signal is inputted; a capacitor charged with and discharging electric charge; a first switch connected to the input signal line and operating according to the input signal when the capacitor is to be charged with electric charge; a second switch connected to the input signal line and operating according to the input signal when the electric charge is to be discharged from the capacitor; and a comparison circuit comparing a voltage of the capacitor and a reference voltage to output a delay signal of the input signal.

According to the input signal, the first switch operates so that the capacitor is charged with the electric charge, and the second switch operates so that the electric charge is discharged from the capacitor. When the capacitor is charged with, for example, a power supply voltage, the time required for discharging the electric charge from the capacitor is longer as the power supply voltage is higher. Since this discharge time corresponds to the delay time, such a characteristic is exhibited that the delay time becomes longer as the power supply voltage is higher. Conversely, the comparison circuit has a characteristic such that its delay time becomes shorter as the power supply voltage is higher. Consequently, the delay characteristics of the both are cancelled out by each other, so that it is possible to reduce the power supply voltage dependency of the delay time.

BRIEF DESCRIPTION OF THE DRAWINGS

FIG. 3 is a circuit diagram showing a first example of a more concrete configuration of the delay circuit in FIG. 1;

DETAILED DESCRIPTION OF THE PREFERRED EMBODIMENTS

Figure 1:
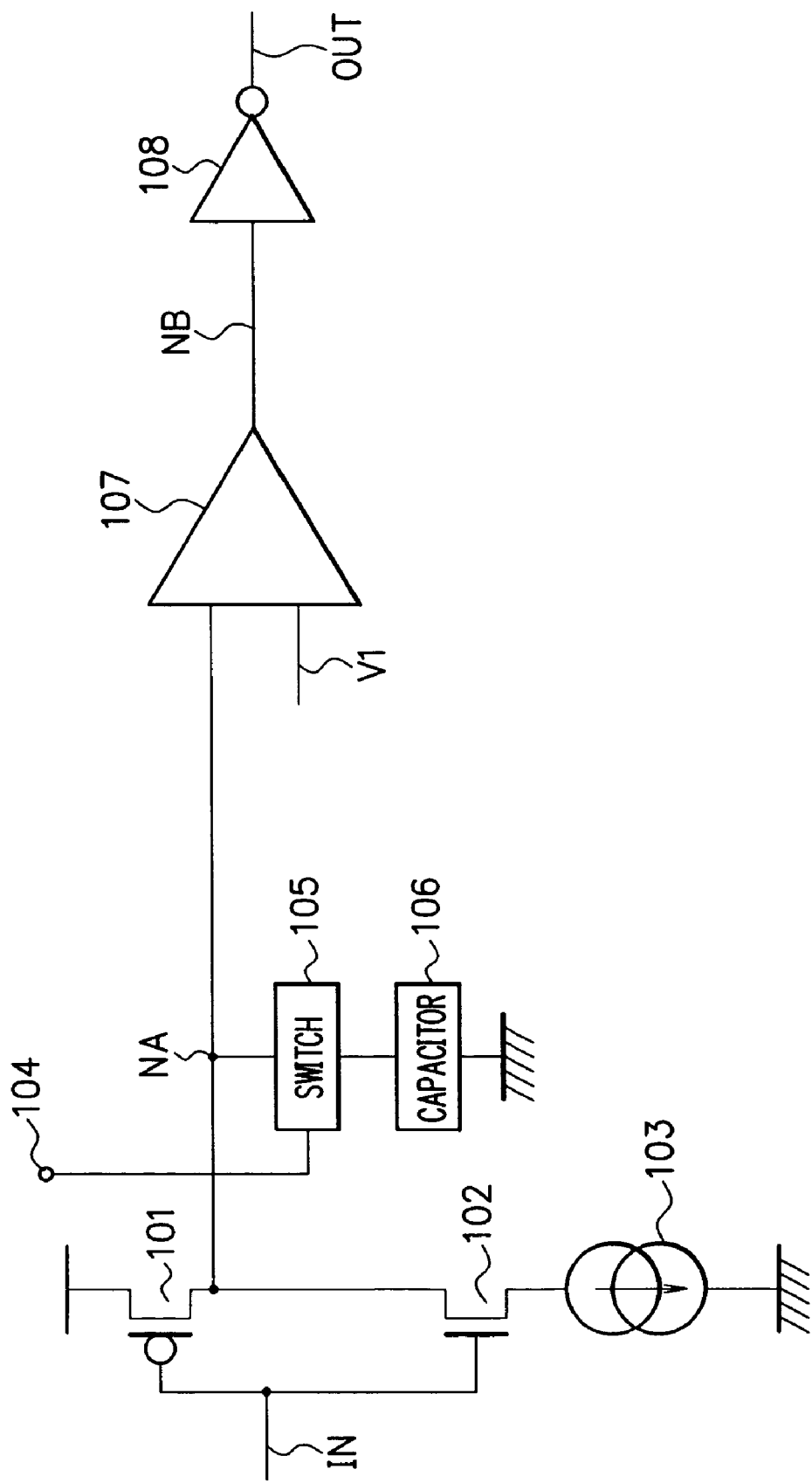
FIG. 1 is a diagram showing a configuration example of a delay circuit according to an embodiment of the present invention.

FIG. 1 shows a configuration example of a delay circuit according to an embodiment of the present invention. An input signal line IN is a line through which an input signal is inputted. A p-channel MOS transistor 101 has a gate connected to the input signal line IN, a source connected to a power supply potential, and a drain connected to a node NA. An n-channel MOS transistor 102 has a gate connected to the input signal line IN and a drain connected to the node NA. A constant current source (constant current circuit) 103 is connected between a source of the transistor 102 and a ground potential. Since the transistors 101 and 102 constitute an inverter, a logic inverted signal of the input signal of the input signal line IN appears at the node NA.

Series connection of a switch 105 and a capacitor 106 is connected between the node NA and the ground potential. When a switch control signal is inputted to a terminal 104, the switch 105 is controlled to turn on or off, so that a capacitance value of the capacitor 106 can be changed. A delay time is determined depending on the capacitance value of the capacitor 106.

When the input signal inputted to the input signal line IN is at low level (ground potential), the transistor 101 turns on and the transistor 102 turns off. When the transistor 101 turns on, a power supply voltage is supplied to the capacitor 106, so that the capacitor 106 is charged with the power supply voltage.

Next, when the input signal of the input signal line IN changes to high level (power supply potential), the transistor 101 turns off and the transistor 102 turns on. When the transistor 102 turns on, the electric charge accumulated in the capacitor 106 is discharged to the ground potential with a constant current via the constant current source 103. This discharge time "t" is expressed by the following equation. Here, "Q" is an amount of the electric charge of the capacitor 106, "i" is discharge current, "C" is a capacitance value of the capacitor 106, and "V" is voltage of the capacitor 106.

$$t=Q/i=CV/i$$

It is understood from this equation that the discharge time "t" is longer as the voltage "V" is higher. This discharge time "t" corresponds to the delay time. Therefore, the higher the power supply voltage with which the capacitor 106 is charged, the longer the delay time is.

Figure 4:
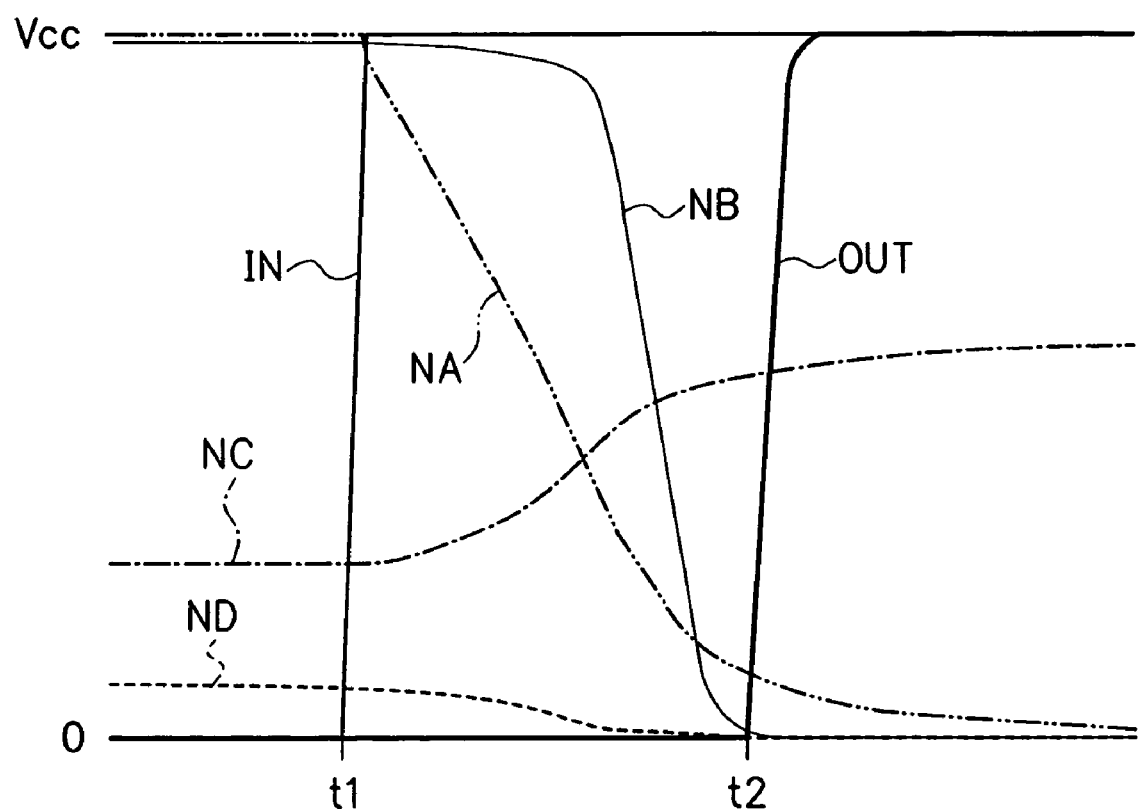
FIG. 4 is a timing chart to describe operations of the delay circuit in FIG. 3.

The voltage of the capacitor 106 is applied to the node NA. A comparator 107 compares the voltage of the node NA and a reference voltage V1 to output an output signal to a node NB according to the comparison result. Specifically, the comparator 107 outputs high level when the voltage of the node NA is higher than the reference voltage V1 while outputting low level when the voltage of the node NA is lower than the reference voltage V1 (see FIG. 4). FIG. 4 will be described in detail later. Similarly to the node NA, a logic inverted signal of the input signal of the input signal line IN appears at the node NB.

The signal of the node NB is inputted to an inverter 108, which then outputs a logic inverted signal of this signal to an output signal line OUT. A delay signal that is the delayed input signal of the input signal line IN is outputted to the output signal line OUT. The delay time of the delay signal corresponds to the time from an instant when the transistor 102 turns on up to an instant when the voltage of the node NA becomes smaller than the reference voltage V1.

As described above, the signal of the node NA has a delay characteristic such that its delay time becomes longer as the power supply voltage is higher. On the other hand, the comparator 107 has an opposite delay characteristic, which will be described later with reference to FIG. 3. Therefore, as the power supply voltage is higher, the delay time of the comparator 107 becomes shorter since its internal transistors operate at higher speed. As a result, the delay time characteristic of the capacitor 106 and the delay time characteristic of the comparator 107 are opposite to each other to cancel out each other. Power supply voltage dependency of the delay signal of the output signal line OUT is reduced.

Figure 2:
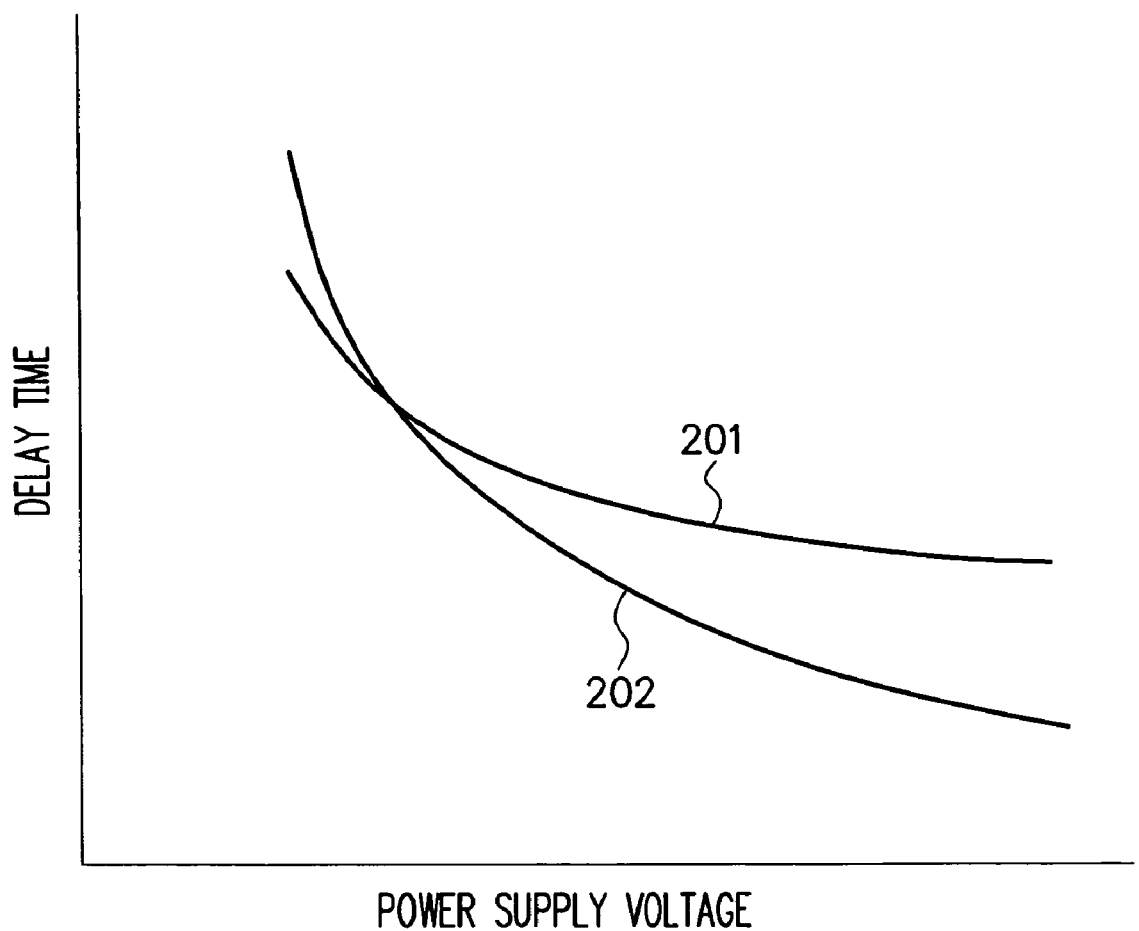
FIG. 2 is a graph showing power supply voltage dependency of delay time.
Figure 9:
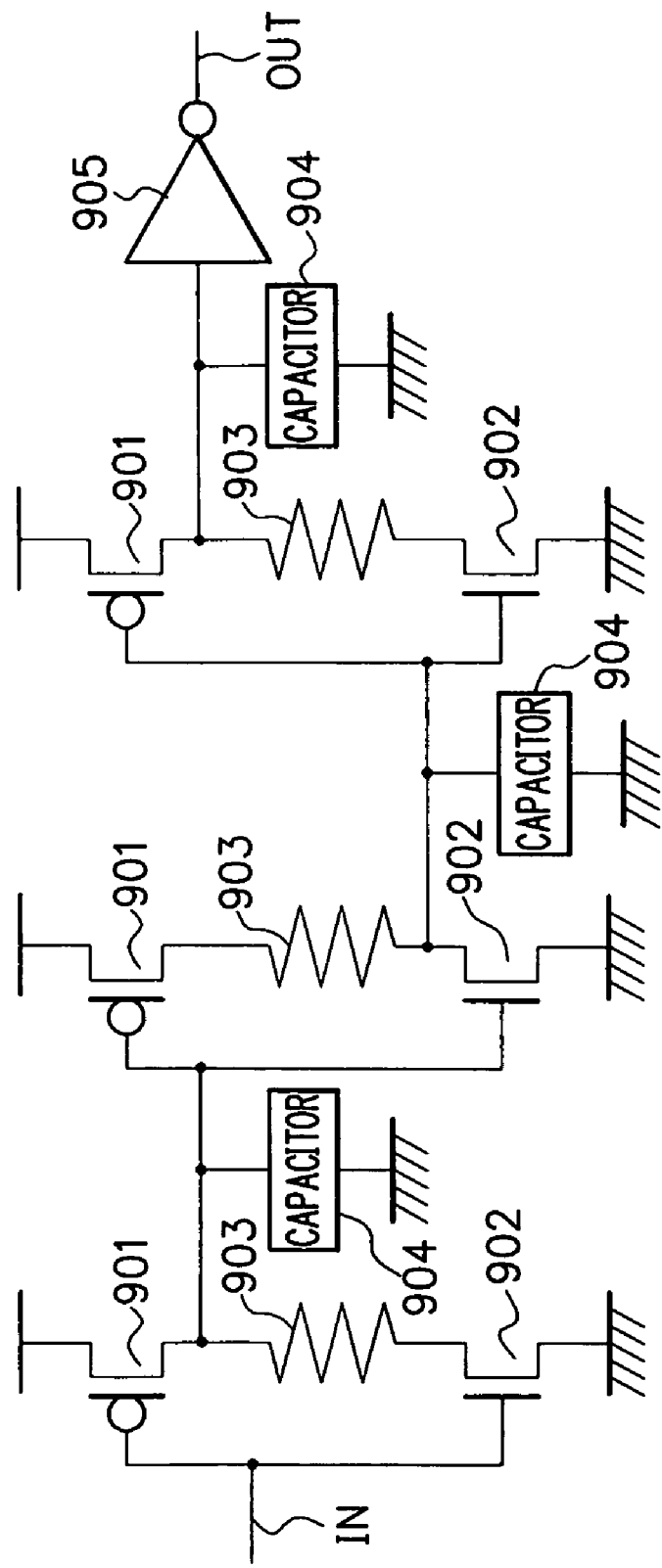
FIG. 9 is a diagram sowing a configuration of a delay circuit according to a conventional art.

FIG. 2 is a graph showing the power supply voltage dependency of the delay time. The horizontal axis shows the power supply voltage and the vertical axis shows the delay time. A characteristic line 201 shows the characteristic of the delay circuit according to this embodiment in FIG. 1. A characteristic line 202 shows the characteristic of the delay circuit in FIG. 9. The characteristic line 202 shows that the delay time becomes longer as the power supply voltage is lower while the delay time is shorter as the power supply voltage is higher, and it exhibits a steep change. That is, the power supply voltage dependency of the delay time is very high. On the other hand, the characteristic line 201 shows that the power supply voltage dependency of the delay time can be reduced owing to the influence of the comparator 107, though basically it exhibits a characteristic such that the delay time is shorter as the power supply voltage is higher. That is, a difference in the delay time depending on a difference in the power supply voltage becomes small.

FIG. 3 shows a first example of a more concrete configuration of the delay circuit in FIG. 1. An input signal line IN is connected to a gate of a p-channel MOS transistor 301 and a gate of an n-channel MOS transistor 302. The transistor 301 corresponds to the transistor 101 in FIG. 1, and the transistor 302 corresponds to the transistor 102 in FIG. 1. The transistor 301 has a source connected to a power supply potential and a drain connected to a node NA. A resistor 311 is connected between the node NA and a drain of the transistor 302. The resistor 311 is not indispensable and may be deleted. An n-channel MOS transistor 303 has a gate connected to a constant potential V2, a source connected to a ground potential, and a drain connected to the source of the transistor 302. The transistor 303, which corresponds to the constant current source 103 in FIG. 1, is capable of supplying a constant current.

A plurality of sets of series connections of a transistor 305 and a capacitor 306 are connected in parallel. The p-channel MOS transistors 305 have gates connected to respective control terminals 304 and sources connected to the node NA. Each of the capacitors 306 is connected between a drain of the transistor 305 and the ground potential. The capacitor 306 is constituted of, for example, an n-channel MOS transistor. Specifically, this n-channel MOS transistor has a gate connected to the drain of the transistor 305, and a source and a drain connected to the ground potential. When the plural control terminals 304 are all set to low level, a capacitance value of the capacitors 306 becomes the maximum value. The capacitance value of the capacitors 306 can be made larger as the number of the low levels inputted to the plural control terminals 304 is larger. Therefore, a variable capacitor can be realized. The plural switches 305 correspond to the switch 105 in FIG. 1 and the plural capacitors 306 correspond to the capacitor 106 in FIG. 1.

Next, the configuration of a comparator 307 will be described. The comparator 307 has a current mirror circuit and corresponds to the comparator 107 in FIG. 1. Hereinafter, the configuration of the current mirror circuit will be described. A p-channel MOS transistor 322c has a gate connected to a node NC, a source connected to a power supply potential, and a drain connected to the node NC. An n-channel MOS transistor 323c has a gate connected to the node NA, a drain connected to the node NC, and a source connected to a node ND. A p-channel MOS transistor 322b has a gate connected to the node NC, a source connected to the power supply potential, and a drain connected to the node NB. An n-channel MOS transistor 323b has a gate connected to a reference potential V1, a drain connected to the node NB, and a source connected to the node ND. An n-channel MOS transistor 324 has a gate connected to an output terminal of a negative-AND (NAND) circuit 314, a drain connected to the node ND, and a source connected to the ground potential. An inverter 308 has an input terminal connected to the node NB and an output terminal connected to an output signal line OUT.

Next, a configuration of a reset circuit will be described. An inverter 312 has an input terminal connected to the output signal line OUT and it outputs a logic inverted signal. An inverter 313 has an input terminal connected to the input signal line IN and it outputs a logic inverted signal. An output signal of the inverter 313 and an output signal of the inverter 312 are inputted to the NAND circuit 314, which then outputs a negative logical product signal. A p-channel MOS transistor 321c has a gate connected to the output terminal of the NAND circuit 314, a source connected to the power supply potential, and a drain connected to the node NC. A p-channel MOS transistor 321b has a gate connected to the output terminal of the NAND circuit 314, a source connected to the power supply potential, and a drain connected to the node NB.

FIG. 4 is a timing chart to describe operations of the delay circuit in FIG. 3. The input signal line IN and the output signal line OUT are at low level (0 V) before a time t1. Since the input signal line IN is at low level, an output signal of the inverter 313 is at high level. Since the output signal line OUT is at low level, an output signal of the inverter 312 is at high level. Therefore, the NAND circuit 314 outputs a low-level output signal. As a result, the transistors 321c and 321b turn on and the transistor 324 turns off. At this time, the comparator 307 does not make the comparison and the node NB becomes at the power supply voltage (high level) Vcc irrespective of the potential of the node NA. Since the node NB is at high level, the inverter 308 outputs low level to the output signal line OUT. At this time, the transistor 324 turns off to bring the comparator 307 into a deactivated state, so that no electric current flows, which can reduce power consumption.

When the input signal line IN is at low level, the transistor 301 turns on and the transistor 302 turns off. As a result, a power supply voltage Vcc is supplied to the capacitors 306, so that the capacitors 306 are charged with the power supply voltage Vcc. The node NA becomes at the power supply voltage Vcc.

It is assumed that at the time t1, the input signal inputted to the input signal line IN next rises from low level to high level. When the input signal line IN becomes at high level, the NAND circuit 314 outputs high level. This causes the transistors 321c and 321b to turn off and the transistor 324 to turn on, so that the comparator 307 is brought into an activated state.

When the input signal line IN becomes at high level, the transistor 301 turns off and the transistor 302 turns on. As a result, the electric charge is discharged from the capacitors 306, so that the constant current flows through the resistor 311 and the transistors 302 and 303. The voltage of the node NA gradually lowers from the power supply voltage Vcc. This voltage drop time of the node NA corresponds to the delay time. The higher the power supply voltage Vcc is, the longer the delay time is.

Next, operations of the current mirror circuit will be described. The transistor 324 functions as a constant current source. When the voltage of the node NA is higher than the reference voltage V1, a large electric current flows through the transistor 323c and a small electric current flows through the transistor 323b. Conversely, when the voltage of the node NA is lower than the reference voltage V1, a large electric current flows through the transistor 323b and a small electric current flows through the transistor 323c. The sum of a value of the electric current flowing through the transistor 323b and a value of the electric current flowing through the transistor 323c is a constant value. Since the gates of the transistors 322b and 322c are both connected to the node NC, the same electric current can flow through the transistors 322b and 322c, so that they function as the current mirror. As a result, when the voltage of the node NA becomes lower, the voltage of the node NB also becomes lower, and in due time, the output signal line OUT of the inverter 308 rises from low level to high level. At the output signal line OUT, the delay signal of the input signal of the input signal line IN appears.

Thereafter, when the input signal of the input signal line IN becomes at low level, the output signal of the output signal line OUT is delayed to also become at low level. As described above, when the input signal line IN and the output signal line OUT both become at low level, the output signal of the NAND circuit 314 becomes at low level, the node NB is fixed at high level, and the output signal line OUT becomes at low level.

As described above, the comparator 307 has the current mirror circuit. As the power supply voltage is higher, the transistors in the current mirror circuit operate at higher speed since their source-drain current becomes larger. As a result, the delay time in the comparator 307 becomes shorter as the power supply voltage is higher.

In the node NA, the delay time becomes longer as the power supply voltage is higher. Conversely, in the comparator 307, the delay time becomes shorter as the power supply voltage is higher. As a result, the delay characteristics of the both are canceled out by each other to reduce the power supply voltage dependency of the delay time.

Figure 5:
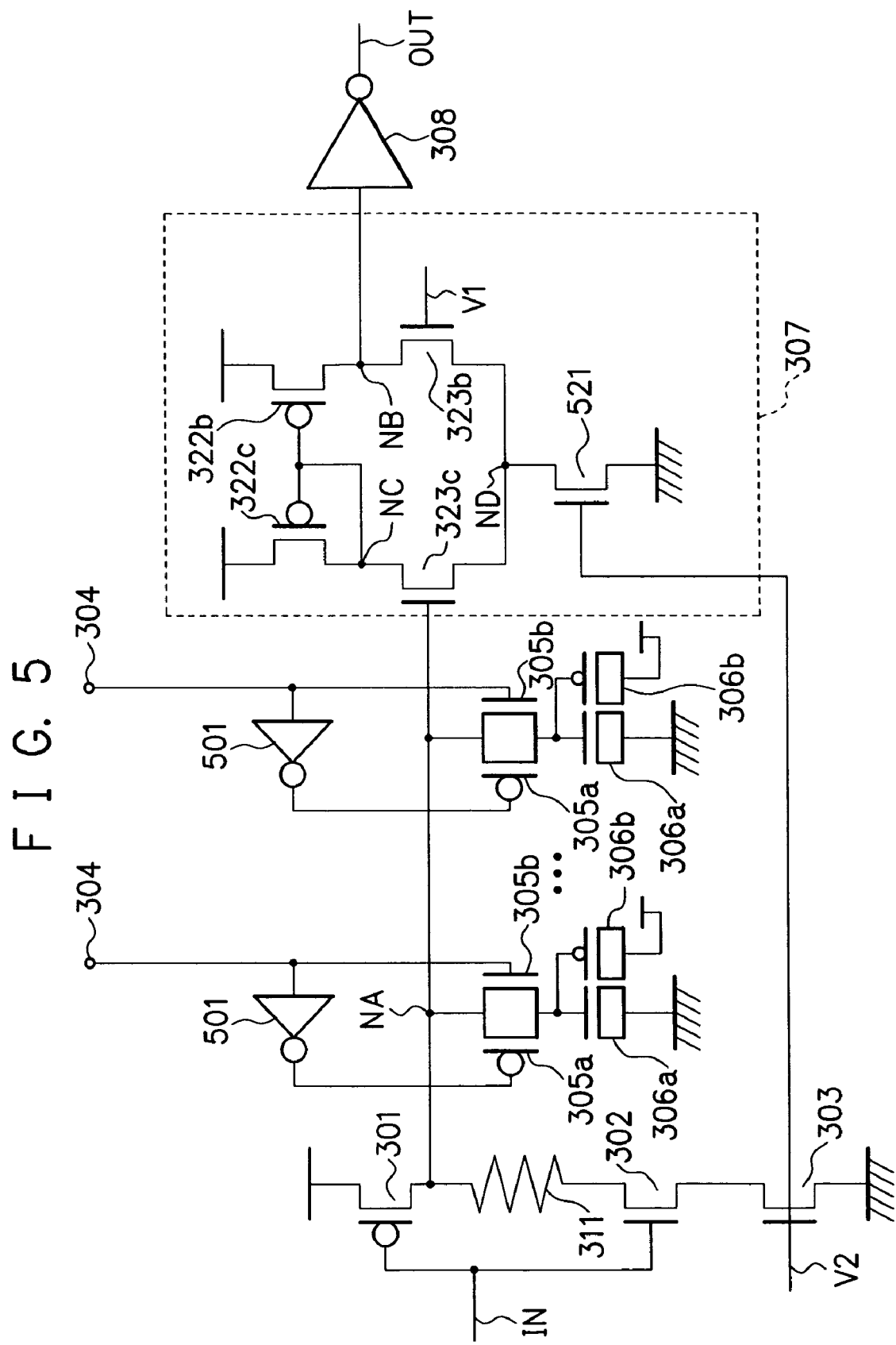
FIG. 5 is a circuit diagram showing a second example of a more concrete configuration of the delay circuit in FIG. 1.

FIG. 5 shows a second example of a more concrete configuration of the delay circuit in FIG. 1. What are different in the delay circuit in FIG. 5 from the delay circuit in FIG. 3 will be described. This delay circuit does not have the reset circuit in FIG. 3, but may have the reset circuit. Transistors 305a and 305b correspond to the transistors 305 in FIG. 3, and capacitors (transistors) 306a and 306b correspond to the capacitors (transistors) 306 in FIG. 3.

The p-channel MOS transistors 305a have gates connected to control terminals 304 via inverters 501 respectively and sources connected to a node NA. The n-channel MOS transistors 305b have gates connected to the control terminals 304 respectively, drains connected to the node NA, and sources connected to drains of the transistors 305a respectively.

Each of the n-channel MOS transistors 306a has a gate connected to the transistors 305a and 305b, and a source and a drain connected to a ground potential. Each of the p-channel MOS transistors 306b has a gate connected to the transistors 305a and 305b, and a source and a drain connected to a power supply potential.

Thus, the switch 105 and the capacitor 106 in FIG. 1 can be constituted using only n-channel MOS transistors, only p-channel MOS transistors, or both of them. In a case where the switch 105 is constituted only of the n-channel MOS transistors, by inputting a voltage larger than the power supply voltage to the gates of these transistors, on-resistance of the transistors can be reduced.

An n-channel MOS transistor 521 has a gate connected to a constant potential V2, a drain connected to a node ND, and a source connected to the ground potential. The transistor 521, which functions as a constant current source, is capable of controlling a constant current value by a constant potential V2.

Figure 6:
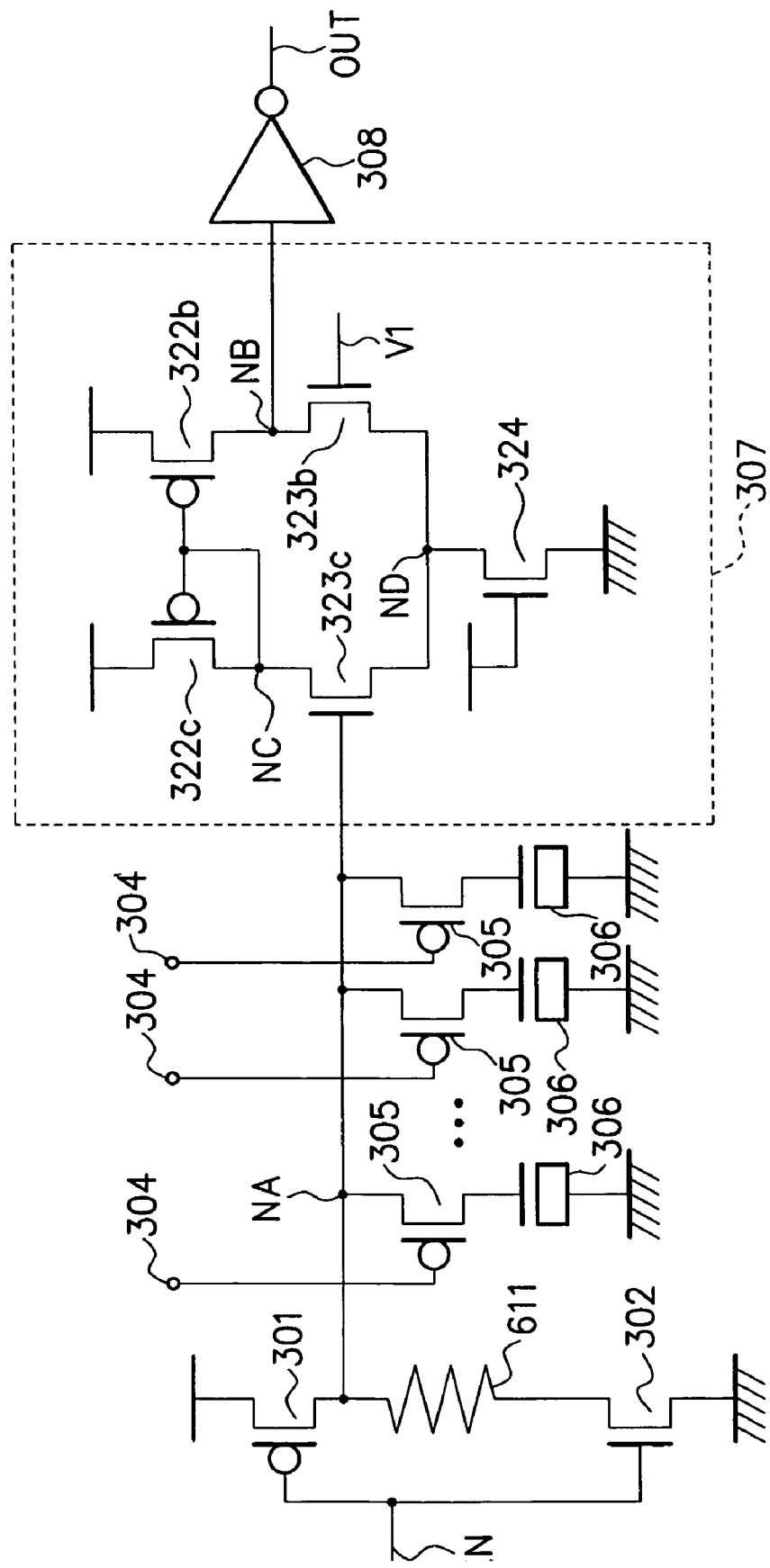
FIG. 6 is a circuit diagram showing a third example of a more concrete configuration of the delay circuit in FIG. 1.

FIG. 6 shows a third example of a more concrete configuration of the delay circuit in FIG. 1. What are different in the delay circuit in FIG. 6 from the delay circuit in FIG. 3 will be described. This delay circuit does not have the reset circuit in FIG. 3 but may have the reset circuit. When the reset circuit is not provided, a gate of a transistor 324 is connected to a power supply potential.

In this delay circuit, a resistor 611 is connected instead of the resistor 311 in FIG. 3, and the transistor 303 in FIG. 3 is deleted. The resistor 611 is a fixed resistor whose resistance value is large and functions as a constant current source. Since the resistor 611 functions as the constant current source, the transistor 303 in FIG. 3 is not required.

Figure 7:
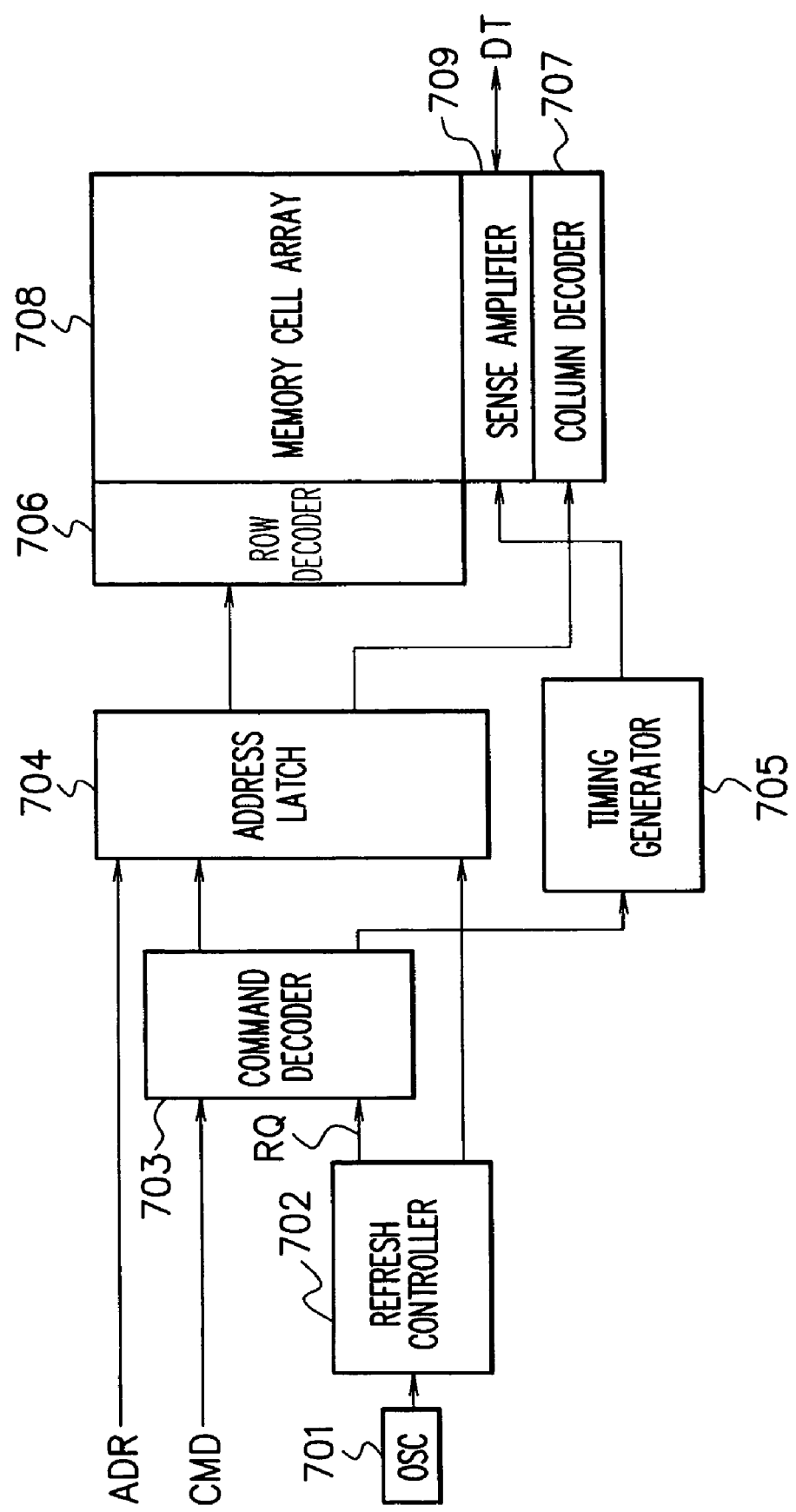
FIG. 7 is a block diagram showing a configuration example of a semiconductor memory device in which the delay circuit according to this embodiment is used.

FIG. 7 shows a configuration example of a semiconductor memory device using the delay circuit according to this embodiment. This semiconductor memory device is a pseudo SRAM (static random access memory). The pseudo SRAM has memory cells with a DRAM (dynamic random access memory) structure and has a built-in refresh circuit that automatically and periodically refreshes the memory cells.

An address ADR and a command CMD can be externally inputted thereto, and data DT can be inputted/outputted thereto/therefrom. For example, for a read operation, a read command as the command CMD and a read address as the address ADR are inputted, and it can read data from a memory cell array 708 and output the read data as the data DAT. For a write operation, a write command as the command CMD, a write address as the address ADR, and write data as the data DT are inputted, and it can write the data to the memory cell array 708.

A command decoder 703 decodes the command CMD to output a control signal to an address latch 704 and a timing generator 705. According to the control signal, the address latch 704 latches the address ADR to output a row address to a row decoder 706 and output a column address to a column decoder 707. The row decoder 706 decodes the row address and the column decoder 707 decodes the column address. The memory cell array 708 has a large number of memory cells arranged two-dimensionally. Each of the memory cells can store data. Based on the decoding by the row decoder 706 and the column decoder 707, memory cells of, for example, 16 bits are selected by word lines.

The timing generator 705 generates a timing signal according to the inputted control signal to output it to a sense amplifier 709. The sense amplifier 709 reads the data from the selected memory cells and amplifies the data to output it as the data DT. Further, the sense amplifier 709 writes the data inputted as the data DT to the selected memory cells.

A refresh controller 702 periodically outputs a refresh command RQ to the command decoder 703 based on an oscillation signal generated by an oscillator 701 and outputs a refresh address to the address latch 704. Consequently, the sense amplifier 709 amplifies the data in the selected memory cells to restore (write back) the data to the memory cells.

Figure 8:
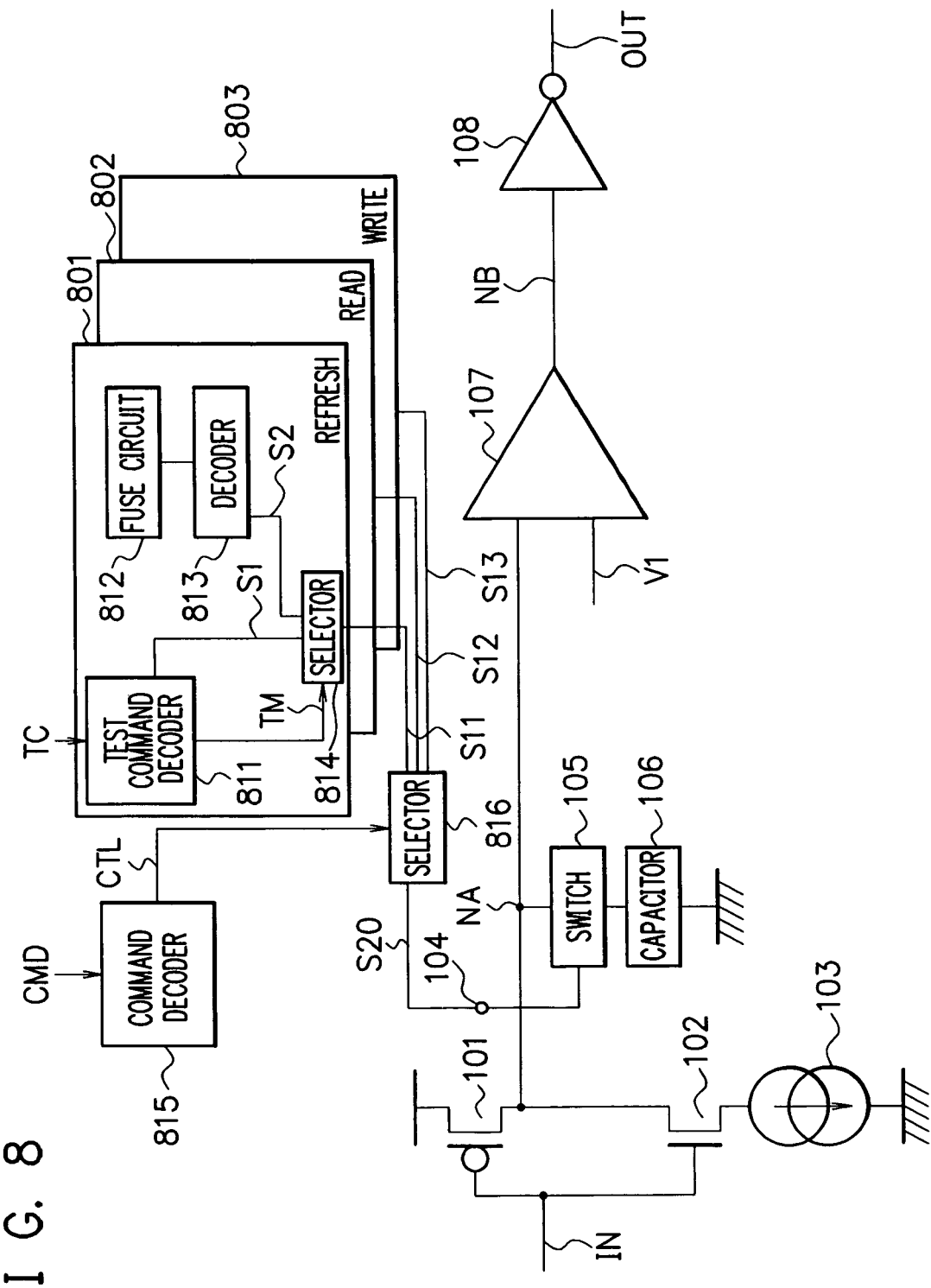
FIG. 8 is a diagram showing a configuration example of a delay circuit used in a pseudo SRAM or a DRAM.

FIG. 8 shows a configuration example of a delay circuit used in a pseudo SRAM or a DRAM. This delay circuit has the same basic configuration as that in FIG. 1 but additionally has a circuit supplying a signal to a control terminal 104. This delay circuit can set different delay times in a refresh operation, a read operation, and a write operation. For example, it can set the delay time for setting the time from the rise of voltage of a word line up to activation of a sense amplifier, or the delay time for setting the time from the activation of the sense amplifier to the drop of the voltage of the word line.

A command decoder 815 decodes a command CMD to output an operation mode signal CTL. The command CMD and the operation mode signal CTL include commands and operation mode signals for refresh, read, and write respectively. A selector 816 selects, according to the operation mode signal CTL, delay time information outputted by one of a refresh delay time setting circuit 801, a read delay time setting circuit 802, and a write delay time setting circuit 803 to output the selected information to the control terminal 104. The selector 816 selects the refresh delay time setting circuit 801 when the operation mode signal CTL is a refresh operation signal, selects the read delay time setting circuit 802 when the operation mode signal CTL is a read operation signal, and selects the write delay time setting circuit 803 when the operation mode signal CTL is a write operation signal.

A configuration of the refresh delay time setting circuit 801 will be described. A test command decoder 811 decodes an inputted test code TC to output delay time information S1 and a test mode signal TM to a selector 814. The test code TC is inputted in a test mode, so that a desired delay time can be set.

A fuse circuit 812 is a memory storing the delay time information for the refresh operation and can store information by fuse connection or fuse blowout. The decoder 813 decodes the delay time information outputted by the fuse circuit 812 to output delay time information S2. In a normal operation mode other than the test mode, the delay time information S2 is used.

The selector 814, when the test mode signal TM is inputted thereto, selects the delay time information S1, and in other cases, selects the delay time information S2 to output refresh delay time information S11.

The read delay time setting circuit 802 and the write delay time setting circuit 803 have the same configuration as that of the refresh delay time setting circuit 801. The read delay time setting circuit 802 outputs delay time information S12 for the read operation. The write delay time setting circuit 803 outputs delay time information S13 for the write operation.

The selector 816 outputs one of the delay time information S11, S12, and S13 as delay time information S20 to the control terminal 104 according to the operation mode signal CTL. A capacitance value of a capacitor 106 is set according to the delay time information S20 as described above.

As described above, the capacitance value of the variable capacitor 106 is variable according to the input of the test code TC, is variable according to the information stored in the fuse circuit 812, and is variable according to the operation mode signal CTL.

In a RAM such as a pseudo SRAM or a DRAM, a predetermined length of time or longer is constantly necessary for the restore time of memory cells. This restore time can be set by the delay time of the delay circuit. Reducing power supply voltage dependency of the delay time can reduce power supply voltage dependency of the restore time and can prevent the access time of the RAM from becoming longer than necessary. That is, it is possible to reduce variation in the access time of the RAM depending on the power supply voltage and to shorten a prescribed value of the access time of the RAM.

According to this embodiment, the transistor 101 in FIG. 1 is a switch connected to the input signal line IN and operating according to the input signal when the capacitor 106 is to be charged with electric charge. The transistor 102 is a switch connected to the input signal line IN and operating according to the input signal when the electric charge is to be discharged from the capacitor 106. The transistors 101 and 102 are switches performing opposite operations according to the input signal. The comparison circuit includes the comparator 107 and the inverter 108 and compares the voltage of the capacitor 106 and the reference voltage V1 to output the delay signal of the input signal.

When the capacitor is charged with, for example, the power supply voltage, it takes a longer time to discharge the electric charge from the capacitor as the power supply voltage is higher. Since this discharge time corresponds to the delay time, such a characteristic is exhibited that the delay time becomes longer as the power supply voltage is higher. Conversely, the comparison circuit exhibits a characteristic such that its delay time becomes shorter as the power supply voltage is higher. Consequently, the delay characteristics of the both are cancelled out by each other, so that power supply voltage dependency of the delay time can be reduced.

It should be noted that the above-described embodiments only show examples of implementing the present invention, and these embodiments should not be interpreted as limiting the technical scope of the present invention. Therefore, the present invention can be implemented in various forms without departing from the technical spirit and major characteristic thereof.

INDUSTRIAL APPLICABILITY

According to an input signal, a first switch operates so that a capacitor is charged with electric charge and a second switch operates so that the electric charge is discharged from the capacitor. When the capacitor is charged with, for example, a power supply voltage, it takes a longer time to discharge the electric charge from the capacitor as the power supply voltage is higher. Since this discharge time corresponds to the delay time, such a characteristic is exhibited that the delay time becomes longer as the power supply voltage is higher. Conversely, a comparator has such a characteristic that its delay time is shorter as the power supply voltage is higher. Therefore, since the delay characteristics of the both are cancelled out by each other, it is possible to reduce power supply voltage dependency of the delay time.

What is claimed is:

1. A delay circuit comprising:
    an input signal line through which an input signal is inputted;
    a capacitor charged with and discharging electric charge;
    a first switch connected to said input signal line and operating according to the input signal when said capacitor is to be charged with electric charge;
    a second switch connected to said input signal line and operating according to the input signal when the electric charge is to be discharged from said capacitor;
    a comparison circuit comparing a voltage of said capacitor and a reference voltage to output a delay signal of the input signal; and
    a reset circuit resetting a level of an output signal line of said comparison circuit according to the input signal and the delay signal.

2. The delay circuit according to claim 1, wherein said first and second switches perform opposite operations according to the input signal.

3. The delay circuit according to claim 1, further comprising a constant current source discharging the electric charge from said capacitor with a constant electric current according to the operation of said second switch.

4. The delay circuit according to claim 1, wherein a power supply voltage is supplied to said capacitor through said first switch to charge said capacitor.

5. The delay circuit according to claim 1, wherein said comparison circuit includes: a comparator comparing the voltage of said capacitor and the reference voltage; and an inverter inverting logic of an output of the comparator.

6. The delay circuit according to claim 5, wherein said capacitor is a variable capacitor and a delay time of the delay signal is adjustable according to a capacitance value of said capacitor.

7. The delay circuit according to claim 6, wherein said variable capacitor has a plurality of sets of a third switch and a capacitor.

8. The delay circuit according to claim 7, wherein said capacitor is constituted of an n-channel transistor and/or a p-channel transistor.

9. The delay circuit according to claim 8, wherein the third switch is constituted of an n-channel transistor and/or a p-channel transistor.

10. The delay circuit according to claim 1, wherein said first switch is a p-channel transistor, and said second switch is an n-channel transistor.

11. The delay circuit according to claim 1, wherein said comparison circuit comprises a current mirror circuit.

12. The delay circuit according to claim 1, wherein said comparison circuit makes the comparison after the input signal rises.

13. The delay circuit according to claim 1, wherein said reset circuit supplies high level to an output signal line of said comparison circuit when the input signal and the delay signal are at low level.

14. The delay circuit according to claim 3, wherein said constant current source is a circuit constituted of an n-channel transistor having a gate to which a fixed voltage is applied.

15. The delay circuit according to claim 3, wherein said constant current source is constituted of a resistor.

16. The delay circuit according to claim 6, wherein the capacitance value of said variable capacitor is variable according to an input of a test code.

17. The delay circuit according to claim 6, wherein the capacitance value of said variable capacitor is variable according to information stored in a memory.

18. The delay circuit according to claim 6, wherein the capacitance value of said variable capacitor is variable according to an operation mode.

19. The delay circuit according to claim 18, wherein the operation mode is one of a refresh operation mode, a read operation mode, and a write operation mode of a semiconductor memory device.

20. A delay circuit comprising:
    an input signal line through which an input signal is inputted;
    a capacitor charged with and discharging electric charge;
    a first switch connected to said input signal line and operating according to the input signal when said capacitor is to be charged with electric charge;

a second switch connected to said input signal line and operating according to the input signal when the electric charge is to be discharged from said capacitor;

a comparison circuit comparing a voltage of said capacitor and a reference voltage to output a delay signal of the input signal;

a constant current source discharging the electric charge from said capacitor with a constant electric current according to the operation of said second switch; and a resistor connected between said capacitor and said constant current source.

* * * * *